(12) United States Patent
Sharma et al.

(10) Patent No.: US 8,630,967 B2
(45) Date of Patent: Jan. 14, 2014

(54) DETERMINING OPERATIONAL SETTINGS FOR FLUID MOVING DEVICES USING A MULTIVARIATE TIME SERIES OF DATA

(75) Inventors: Ratnesh Kumar Sharma, Fremont, CA (US); Manish Marwah, Palo Alto, CA (US); Debprakash Patnaik, Bellevue, WA (US); Naren Ramakrishnan, Blacksburg, VA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 441 days.

(21) Appl. No.: 12/632,682

(22) Filed: Dec. 7, 2009

(65) Prior Publication Data

US 2011/0137469 A1    Jun. 9, 2011

(51) Int. Cl.
*G06E 1/00*     (2006.01)
*G06E 3/00*     (2006.01)
*G06F 15/18*    (2006.01)
*G06G 7/00*     (2006.01)

(52) U.S. Cl.
USPC ............................................................. 706/26

(58) Field of Classification Search
USPC .......................................................... 706/22
See application file for complete search history.

(56) References Cited

U.S. PATENT DOCUMENTS

| 6,868,682 | B2 | 3/2005 | Sharma et al. |
| 6,882,904 | B1 | 4/2005 | Petrie et al. |
| 7,472,558 | B1 * | 1/2009 | Narita .............................. 62/175 |
| 2003/0079483 | A1 * | 5/2003 | Komatsu et al. ................. 62/148 |
| 2007/0239694 | A1 * | 10/2007 | Singh et al. ........................ 707/3 |
| 2007/0295501 | A1 * | 12/2007 | Poulisse .................... 166/250.01 |

OTHER PUBLICATIONS

'Sustainable operation and management of data center chillers using temporal data mining': Patnaik, 2009, ACM, 978-1-60558-495.*
'Visual analysis of frequent patterns in large time series': Hao, 2010, IEEE, 978-1-4244-9487.*
Debprakash Patnaik et al. Sustainable Operation and Management of Data Center Chillers using Temporal Data Mining, Virginia Tech, HP Labs, 2009.
Patnaik et al. Sustainable operation and management of data center chillers using temporal data mining, 15th ACM Int'l conference, Paris France, Jun. 2009.
L. Bautista and R. Sharma. Analysis of environmental data in datacenters. Technical report, HP Labs, 2007.
B. Chiu, et al. Probabilistic discovery of time series motifs. In KDD '03: Proceedings of the ninth ACM SIGKDD Int'l conference, pp. 493-498, New York, NY, US 2003.
Hui Ding, et al. Querying and mining of time series data: experimental comparison of representations and distance measures. Proc. VLDB ENdow. 1(2):1542-1552, 2008.
E. Hoke et al. Intemon: intelligent system monitoring on large clusters. In VLDB '06 pates 1239-1242. VLDB Endowment, 2006.

(Continued)

*Primary Examiner* — Kakali Chaki
*Assistant Examiner* — Peter Coughlan (57) ABSTRACT

In a method for determining operational settings for a plurality of fluid moving devices, one or more motifs in utilization data of the plurality of fluid moving devices collected over a time series is identified as a multivariate time series of data, sustainability metric levels for each of the one or more identified motifs are calculated, and a determination as to which of the one or more identified motifs have favorable sustainability metric levels is made.

15 Claims, 7 Drawing Sheets

(56) References Cited

OTHER PUBLICATIONS

S. Laxman et al. Discovering frequent episodes and learning hidden markov models: A formal connection. IEEE Transaction on Knowledge and Data Engineering, 17(11):15051517,2005.

S. Laxman et al. Stream prediction using a generative model based on frequent episodes in event sequences, KDD'08, p. 453461, Aug. 2008.

Y. Liang et al. Failure prediction in ibm bluegene/I event logs, ICDM '07, pp. 583-588, Washington DC, 2007, IEEE Computer Society.

J. Lin et al. A symbolic representation of time series, with implications for streaming algorithms, DMKD '03, pp. 2-11, New York, 2003, ACM.

J. Lin et al. Finding motifs in time series, Proceedings of the second workshop on temporal data mining, pp. 53-68, 2002.

J. Lin et al. Experiencing sax: a novel symbolic representation of time series. Data Min. Knowl. Disc., 15(2):107-144, 2007.

S. Lohr. Demand for data puts engineers in spotlight. New York Times. Published Jube 17, 2008.

H. Mannila et al. Discovery of frequent episodes in event sequences. Data Min. Knowl. Discov. 1(3):259-289, 1997.

M. Marwah et al. Stream mining of sensor data for anomalous behavior detection in data centers. Technical report, HP Labs, 2008.

P. McLachlan et al. Liverac: interactive visual exploration of system management time-series data. In CHI '08: Proceeding of the 26th annual SIGCHI, pp. 1483-2492, 2008 ACM.

S. Papadimitriou et al. In VLDB '05: Proceedings of the 31st conf., pp. 697-708, VLDB Endowment, 2005.

P. Patel et al. Mining motifs in massive time series databases. In ICDM '02: Proceddings of 2002 IEEEE Int'l conf. p. 370, Washington DC. 2002.

D. Patnaik et al. INferring neuronal network connectivity from spike data: A temporal data mining approach, Scientific programming, 16(1):49-77, 2008.

J. Roddick et al. Higher order nububg. SIGKDD Explor. Newsletter, 10 (1):5-17, 2008.

A. Wissner-Gross. Revealed: the environmental impact of google searches. The Sunday Times. Jan. 11, 2009.

X. Xuan et al. Modeling changing dependency structure in multivariate time series. In ICML '07: Proceedings of 24th int'l conf., pp. 1055-1062, NY, 2007. ACM.

D. Yankov et al. Detecting time series motifs under uniform sclaing. In KDD'07: Proceedings of the 13th ACM SIGKDD int'l conf., pp. 844-853, NY, 2007. ACM.

Moore et al ~ "Making Scheduling Cool: Temperature-Aware Workload Placement in Data Centers" ~ USENIX Annual Technical Conference ~ 2005 ~ pp. 14.

* cited by examiner

DETERMINING OPERATIONAL SETTINGS FOR FLUID MOVING DEVICES USING A MULTIVARIATE TIME SERIES OF DATA

BACKGROUND

Data centers have become a ubiquitous element of modern IT infrastructure, especially in the services sector that requires "always-on" capability. Practically every large IT organization hosts a data center, either in-house or outsourced to major vendors. Furthermore, the recent emergence of the software as a service (SaaS) paradigm or more generically, cloud computing, coupled with emerging Web-based business, social networking and media applications and services have led to a tremendous growth in the number, size, and power densities of data centers. This increase has also been accompanied by equally tremendous increases in the amount of power required to operate cooling infrastructures of the data centers, which has also resulted in increases in the carbon footprints of the cooling infrastructures.

Conventional data centers are often configured to provide capabilities for adaptive, configurable operation at the level of each subsystem, such as power distribution, cooling, and compute server racks. The traditional approach to perform such adaptation is to conduct detailed computational fluid dynamics (CFD)-based modeling of air temperature flows through the data center. However, these traditional approaches are computationally intensive, which causes these approaches to require relatively long periods of time to implement. One result of this lengthy implementation time is that these traditional approaches are typically impractical for active cooling infrastructure control processes.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are a method and an analyzer for automatically determining operational settings for a plurality of fluid moving devices that substantially optimize one or more sustainability metric levels while meeting heat dissipation demands in an infrastructure. More particularly, the method and analyzer are configured to identify motifs in utilization data of the fluid moving devices over a time series as a multivariate time series of data and to calculate sustainability metric levels for one or more of the identified motifs. In addition, the method and analyzer are configured to filter out one or more of the identified motifs through performance of a frequent episode mining operation on the identified motifs.

Through implementation of the method and analyzer disclosed herein, the operational settings for a plurality of fluid moving devices that are likely to result in substantially optimized sustainability metric levels, while meeting reliability and performance constraints in an infrastructure, may automatically be determined.

Figure 1:
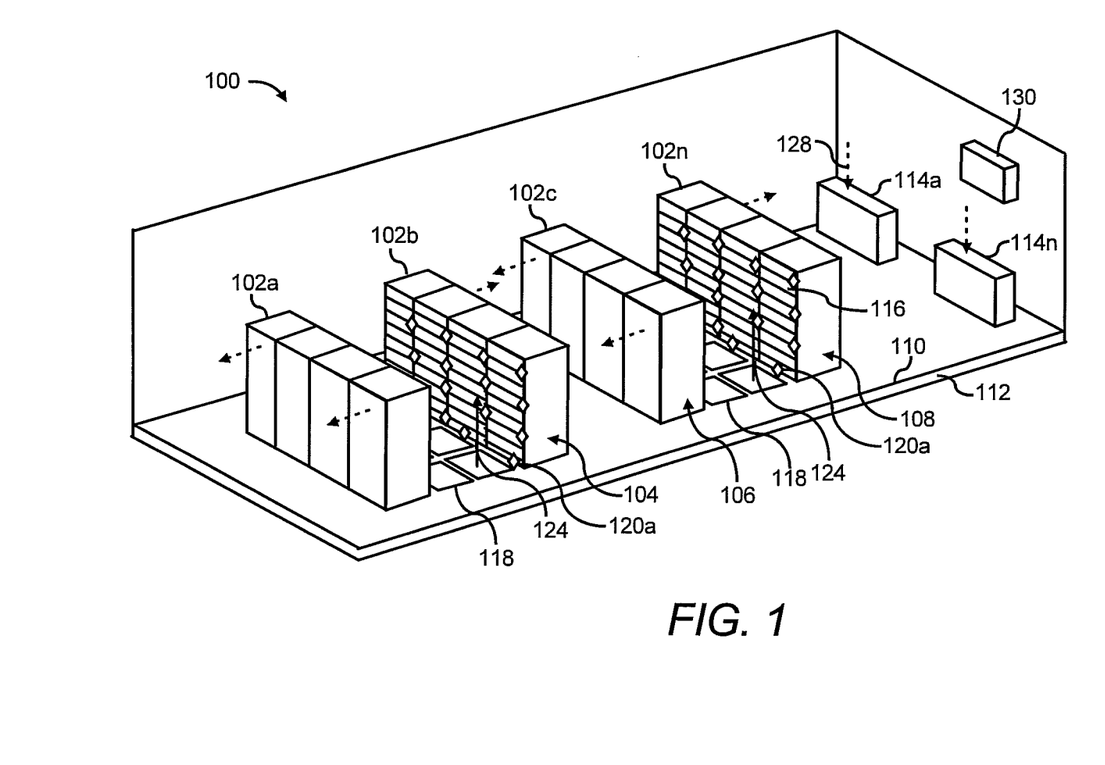
FIG. 1 shows a simplified perspective view of a section of an infrastructure, in this instance, a data center, in which a method and analyzer for determining operational settings for a plurality of fluid moving devices disclosed herein may be implemented, according to an embodiment of the invention.

With reference first to FIG. 1, there is shown a simplified perspective view of a section of an infrastructure 100, in this instance, a data center, in which a method and analyzer for determining operational settings for a plurality of fluid moving devices disclosed herein may be implemented, according to an example. It should be understood that the infrastructure 100 may include additional elements and that some of the elements described herein may be removed and/or modified without departing from a scope of the infrastructure 100.

The infrastructure 100 is depicted as having a plurality of racks 102a-102n, a plurality of fluid moving devices 114a-114n, a plurality of sensors 120a-120n, and an analyzer 130. The racks 102a-102n are positioned on a raised floor 110 and house electronic devices 116 capable of generating/dissipating heat, for instance, computers, servers, bladed servers, disk drives, displays, etc. As shown in FIG. 1, when the fluid comprises a gas, such as air or a gaseous refrigerant, the fluid is delivered through fluid delivery devices 118 in the floor 110 to the racks 102a-102n, as denoted by the arrows 124. In other instances in which the fluid comprises a liquid, such as water, a liquid refrigerant, a multi-state refrigerant, etc., the fluid may be delivered to the racks 102a-102n through a series of pipes (not shown). The fluid moving devices 114a-114n generally operate to supply fluid flow to a space 112 beneath the raised floor 110, and in certain instances to cool heated fluid (indicated by the arrows 128).

The fluid moving devices 114a-114n may comprise widely available, conventional air conditioning (AC) units, such as, water cooled chillers, air cooled chillers, etc. In any regard, the fluid moving devices 114a-114n consume relatively large amounts of energy in cooling heated fluid flow received from the infrastructure 100 and in supplying the racks 102a-102n with the cooled fluid flow. In any regard, the cooled fluid contained in the space 112 may include cooled fluid supplied by one or more fluid moving devices 114a-114n, and in certain instances, fluid flow recirculated into the space 112. Thus, characteristics of the cooled fluid, such as, temperature, pressure, humidity, flow rate, etc., delivered to various locations in the infrastructure 100 may substantially be affected by the operations of a plurality of the fluid moving devices 114a-114n. As such, determining how the fluid moving devices 114a-114n are to be efficiently operated to maintain desired conditions in the infrastructure 100 is a relatively complex problem.

Various manners in which the operational settings for the fluid moving devices 114a-114n may be determined to enable the fluid moving devices 114a-114n to be operated in relatively efficient matters while meeting heat dissipation requirements in the infrastructure 100 are discussed in greater detail herein below. According to an example, optimized operational settings for the fluid moving devices 114a-114n that minimize the sustainability impact of operating the fluid moving devices 114a-114n in meeting the heat dissipation requirements in the infrastructure 100 are determined through implementation of the method and the analyzer discussed herein. According to another example, optimized operational settings for the fluid moving devices 114a-114n that maximize the average lifespans of the fluid moving devices 114a-114n are determined through implementation of the method and the analyzer 130 discussed herein.

As described in greater detail herein below, the analyzer 130 may collect data pertaining to the utilization levels of the fluid moving devices 114a-114n over a series of time. In this regard, the analyzer 130 may be networked with sensors (not shown) and/or actuators (not shown) of the fluid moving devices 114a-114n to collect this information. The utilization levels may include, for instance, the operating levels, cooling loads, power consumption levels, etc., of each of the fluid moving devices 114a-114n. In addition, the analyzer 130 is configured to analyze the collected utilization levels to determine operational settings for the fluid moving devices 114a-114n that yield favorable sustainability results. By way of example, the analyzer 130 is configured to analyze the collected data to determine if there have been periods of time in the past when the operations of the fluid moving devices 114a-114n were determined to be relatively efficient. More particularly, the analyzer 130 is configured to identify motifs or patterns in the collected data to calculate the sustainability results of fluid moving devices 114a-114n over various periods of time to make this determination, as discussed in greater detail herein below.

Figure 2:
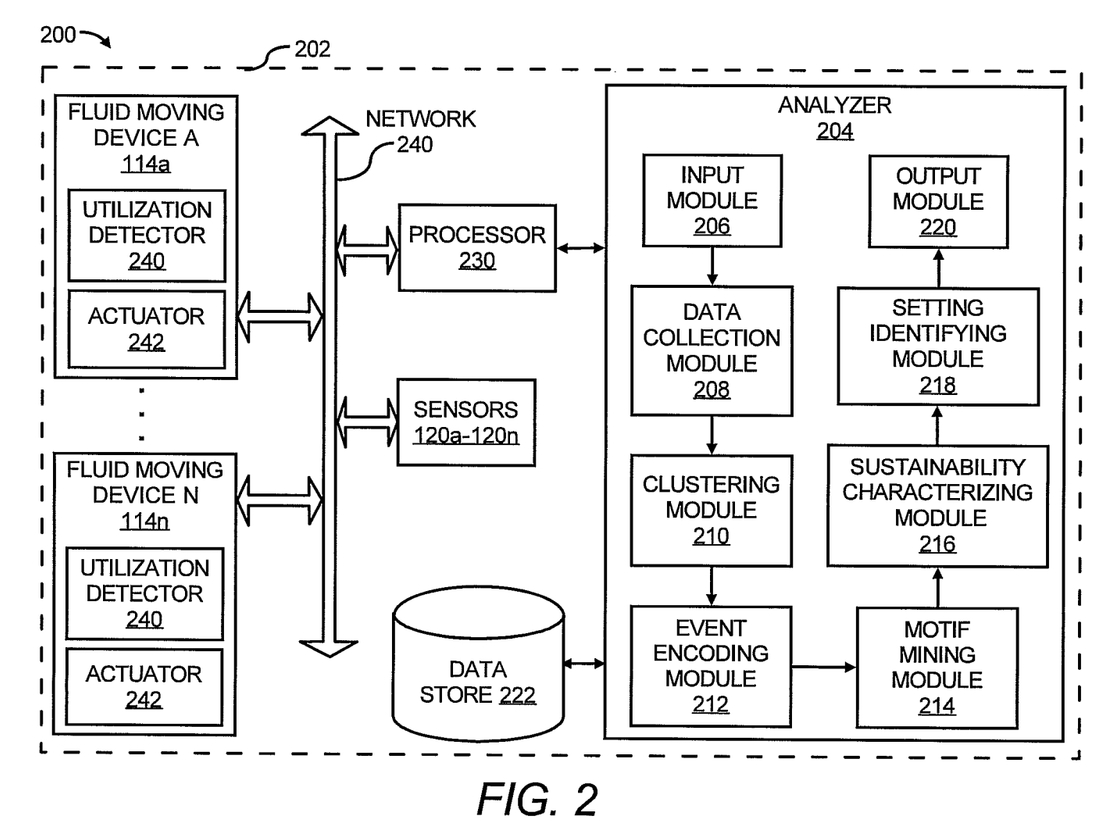
FIG. 2 shows a block diagram of a system for determining operational settings for a plurality of fluid moving devices in an infrastructure, such as the infrastructure depicted in FIG. 1, according to an embodiment of the invention.

Turning now to FIG. 2, there is shown a block diagram 200 of a system 202 for determining operational settings for a plurality of fluid moving devices 114a-114n in an infrastructure, such as the infrastructure 100 depicted in FIG. 1, according to an example. It should be understood that the following description of the block diagram 200 is but one manner of a variety of different manners in which such a system 202 may be configured. In addition, it should be understood that the system 202 may include additional components and that some of the components described herein may be removed and/or modified without departing from a scope of the system 202. For instance, the system 202 may include any number of sensors, memories, processors, fluid moving devices, etc., as well as other components, which may be implemented in the operations of the system 202.

As shown, the system 202 includes an analyzer 204, which may comprise the analyzer 130 depicted in FIG. 1. The analyzer 204 is depicted as including an input module 206, a data collection module 208, a clustering module 210, an event encoding module 212, a motif mining module 214, a sustainability characterizing module 216, a setting identifying module 218, and an output module 220. According to an example, the analyzer 204 comprises software stored, for instance, in a volatile or non-volatile memory, such as DRAM, EEPROM, MRAM, flash memory, floppy disk, a CD-ROM, a DVD-ROM, or other optical or magnetic media, and the like. In this example, the modules 206-220 comprise software modules stored in the memory, which are executable by a processor 230 of a computing device. According to another example, the analyzer 204 comprises a hardware device, such as, a circuit or multiple circuits arranged on a board. In this example, the modules 206-220 comprise circuit components or individual circuits, which may also be controlled by a processor of a computing device. According to a further example, the analyzer 204 comprises a combination of hardware and software modules.

Generally speaking, the analyzer 204 is configured to determine operational settings for the fluid moving devices, for instance, the fluid moving devices 114a-114n of the infrastructure 100 depicted in FIG. 1. According to an example, the analyzer 204 is configured to determine operational settings for the fluid moving devices 114a-114n that result in substantially optimized sustainability levels in cooling a particular heat load in the infrastructure 100. Thus, for instance, the analyzer 204 is configured to determine operational settings that result in one or more of minimized power consumption, minimized carbon footprint, minimized energy loss, maximized useful lifespans, etc., of the fluid moving devices 114a-114n in meeting cooling demands of heat dissipating devices in the infrastructure 100.

According to an example, the analyzer 204 is configured to determine the operational settings based upon information received from utilization detectors 240 of the fluid moving devices 114a-114n. In this example, the utilization detectors 240 may comprise sensors configured to detect, for instance, power consumption levels, operating levels, etc. In another example, the analyzer 204 is configured to receive data pertaining to the utilization levels of the fluid moving devices 114a-114n from another source or from a correlation between the utilization levels and, for instance, differences in the temperatures of fluid flow into and out of the fluid moving devices 114a-114n. In any regard, the analyzer 204 may receive the utilization data over a network 240 that operates to couple the various components of the system 202 or from a data storage location where the utilization data is stored prior to retrieval by the analyzer 204. The network 240 generally represents a wired or wireless structure in the infrastructure for the transmission of data between the various components of the system 202.

In any regard, the analyzer 204 is configured to store the condition information received from the sensors 120a-120n in a data store 222, which may comprise any reasonably suitable memory upon which the analyzer 204 may store data and from which the analyzer 204 may retrieve data. Although the data store 220 has been depicted as forming a separate component from the analyzer 204, it should be understood that the data store 220 may be integrated with the analyzer 204 without departing from a scope of the system 200.

The analyzer 204 may also output the determined operational settings through the output module 220. Thus, for instance, the determined operational settings may be outputted to a display upon which the outputted information may be displayed, a printer upon which the outputted information may be printed, a connection over which the outputted information may be conveyed to another computing device, a data storage device upon which the outputted information may be stored, etc.

According to a particular example where the processor 230 is configured to control operations of the fluid moving devices 114a-114n, the processor 230 may receive the determined operational settings and may transmit instructions over the network 230 to the fluid moving devices 114a-114n to vary operations of one or more of the fluid moving devices 114a-114n to match the determined operational settings. As shown, each of the fluid moving devices 114a-114n includes an actuator 242, which generally comprise devices for controlling aspects of the fluid flow supplied by the fluid moving devices 114a-114n, such as temperature and/or flow rate.

Figure 3:
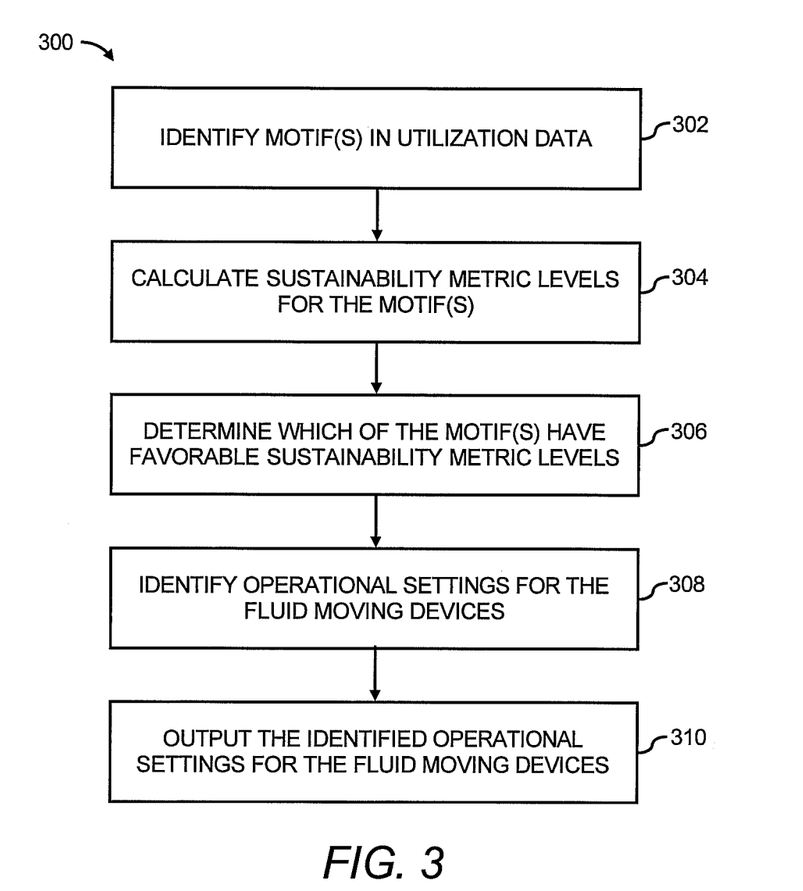
FIGS. 3 and 4, respectively, depict flow diagrams of methods for determining operational settings for a plurality of fluid moving devices, according to an embodiment of the invention.
Figure 4:
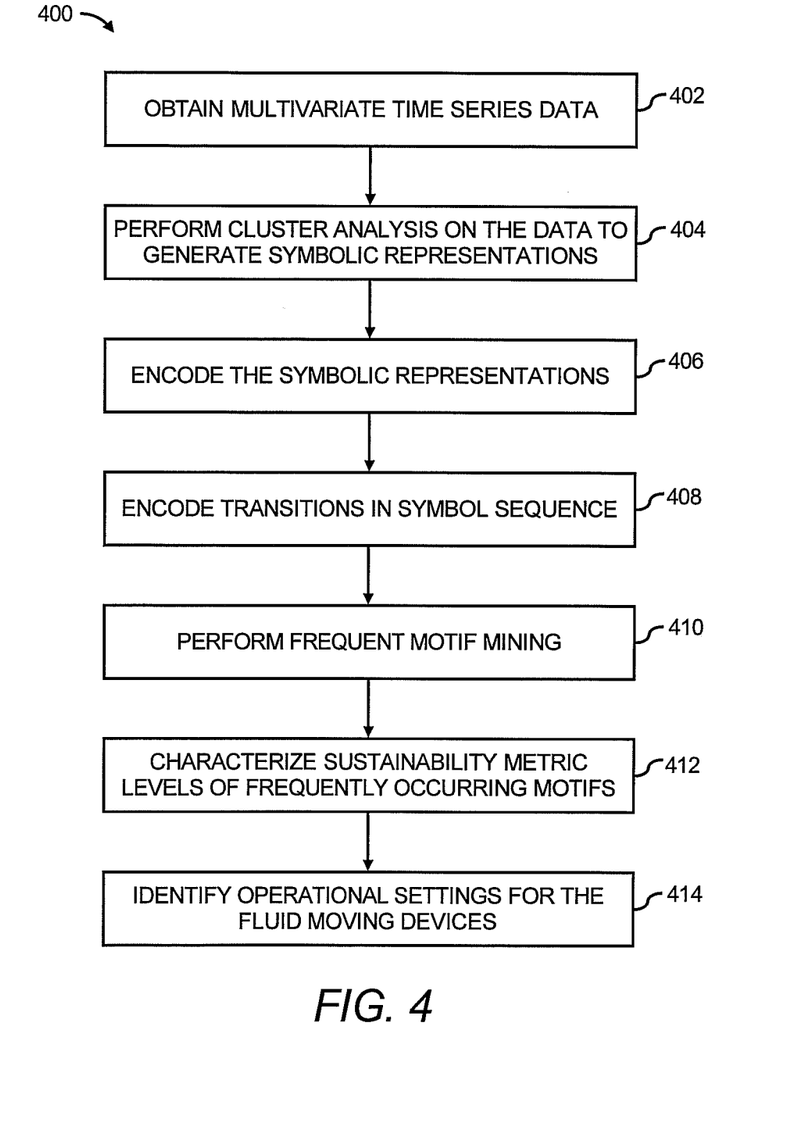

Various manners in which the modules 204-220 of the analyzer 204 may operate are discussed with respect to the methods 300 and 400 depicted in FIGS. 3 and 4. FIG. 3, more particularly depicts a flow diagram of a method 300 for determining operational settings for a plurality of fluid moving devices, according to an example. In addition, the method 400 provides additional details pertaining to the steps contained in the method 300, according to an example. It should be apparent to those of ordinary skill in the art that the methods discussed below with respect to FIGS. 3 and 4 represent generalized illustrations and that other steps may be added or existing steps may be removed, modified or rearranged without departing from the scopes of the methods 300 and 400.

Although particular reference is made to the analyzer 204 depicted in FIG. 2 as performing the steps outlined in the methods 300 and 400, it should be understood that the methods 300 and 400 may be performed by a differently configured analyzer without departing from the scopes of the methods 300 and 400.

At step 302, one or more motifs in utilization data of the fluid moving devices 114a-114n collected over a time series are identified, for instance, by the motif mining module 214. In addition, at step 304, sustainability metric levels for the one or more motifs identified at step 302 are calculated, for instance, by the sustainability characterizing module 216.

At step 306, an identification of which of the one or more motifs have favorable sustainability metric levels is made, for instance, by the sustainability characterizing module 216. In addition, at step 308, the operational settings that correspond to the one or more motifs having favorable sustainability metric levels are identified as being suitable for the fluid moving devices 114a-114n, for instance, the setting identifying module 218.

At step 310, the operational settings identified at step 308 as having favorable sustainability metric levels are outputted, for instance, by the output module 220. As discussed above, the operational settings may be outputted for consideration by an operator of the fluid moving devices 114a-114n, the operational settings may be outputted to another computing device for further computation, the operational settings may be communicated to controllers of one or more of the fluid moving devices 114a-114n, etc.

With particular reference now to FIG. 4, the method 400 depicted therein comprises more detailed steps pertaining to the steps included in the method 300. Thus, for instance, the steps outlined in the method 400 provide more detail with respect to some or all of the steps outlined in the method 300. As such, steps 402-410 in the method 400 provide a more detailed description of a manner in which the motifs in the utilization data may be identified at step 302 in the method 300. In addition, step 410 in the method 400 provides a more detailed description of a manner in which the sustainability metric levels for the motifs may be calculated at steps 304 and 306 in the method 300. Moreover, step 414 in the method 400 provides a more detailed description of a manner in which the operational settings for the fluid moving devices 114a-114n may be identified at step 308 in the method 300.

Figure 5A:
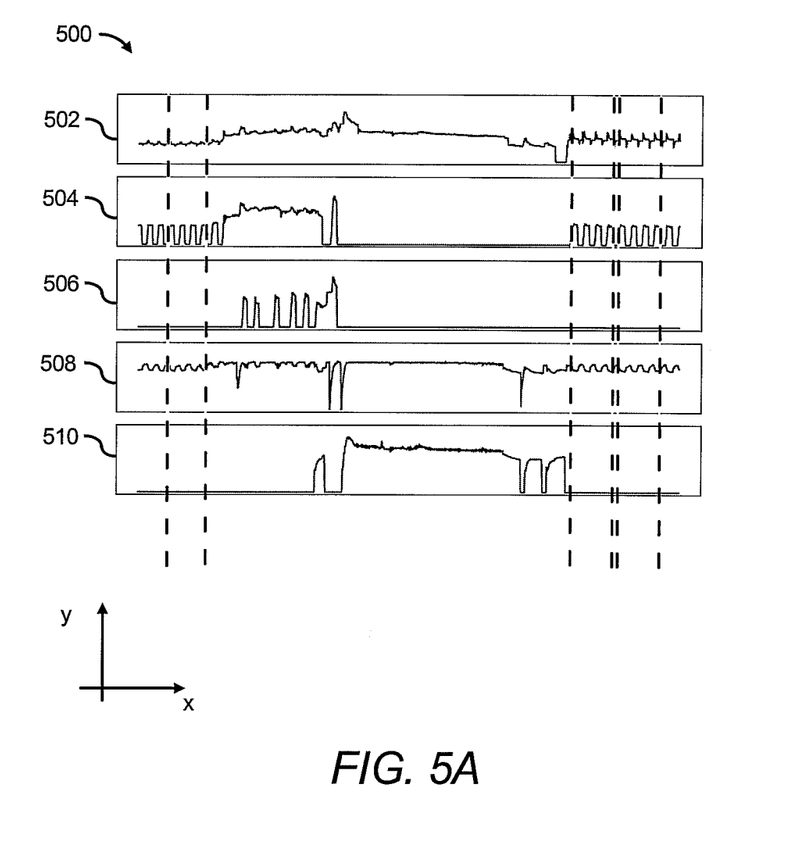
FIG. 5A depicts a diagram of a multivariate time series data, according to an embodiment of the invention.

At step 402, multivariate time series data is obtained, for instance, through the input module 206. The analyzer 204 may obtain the multivariate time series data directly from the sensors 120a-120n or may retrieve the multivariate time series data from a storage location, such as, the data store 222. In any regard, the multivariate time series data ($T=(t_1, \ldots, t_m)$) is an ordered set of real-valued vectors of a particular variable. Each of the real-valued vectors ($t_i$) captures the utilizations across all of the fluid moving devices 114a-114n. An example of the multivariate time series data 500 is depicted in FIG. 5A. As shown therein, the multivariate time series data 500 depicts the utilization levels 502-510 for five fluid moving devices 114a-114n (y-axis) over a period of time (x-axis). As discussed in greater detail in the following steps, a temporal data mining operation is performed on the multivariate time series data 500 to identify motifs or patterns in the data. In addition the motifs or patterns are used to determine settings for the fluid moving devices 114a-114n that result in desired or optimized sustainability attributes.

At step 404, a clustering analysis is performed on the multivariate time series data to identify vectors having similar behavior, for instance, by the clustering module 210. By way of particular example, the clustering module 210 may perform a clustering operation on the real-valued vectors ($t_i$) contained in the multivariate time series data to generate a plurality of clusters, in which each of the clusters contain the real-valued vectors ($t_i$) that are closely related to each other. According to an example, the clustering module 210 is configured to implement a clustering algorithm, such as, hierarchical clustering, K-means clustering, K-medoid clustering, fuzzy c-means clustering, spectral clustering, etc., to generate the clusters.

Figure 5B:
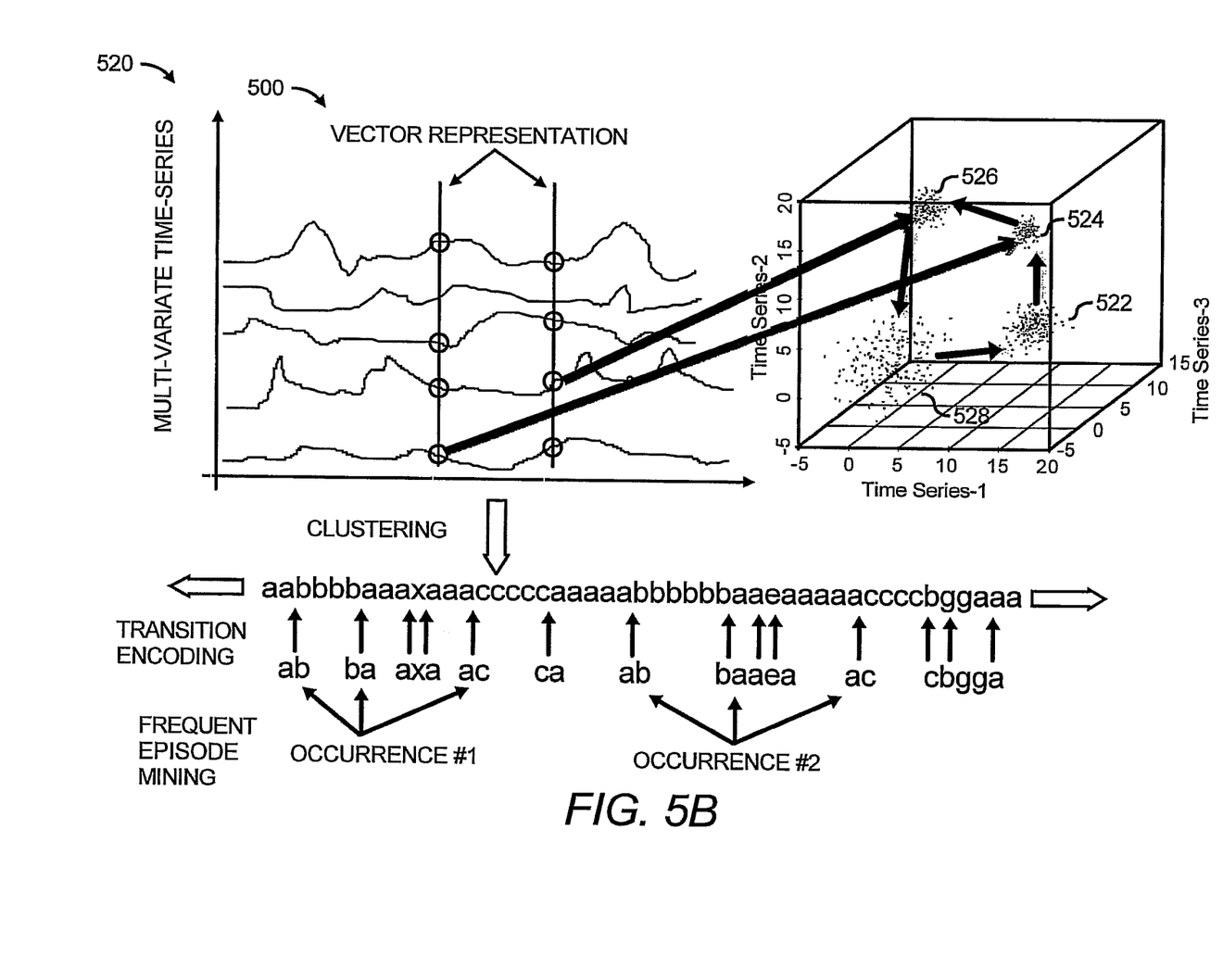
FIG. 5B depicts a diagram that graphically illustrates a data mining operation, according to an embodiment of the invention.

An example of the generated clusters 522-528 for three fluid moving devices 114a-114c is depicted in the diagram 520 of FIG. 5B. As depicted therein, the "time series-1" pertains to the utilization levels of a first fluid moving device 114a over a particular time series, the "time series-2" pertains to the utilization levels of a second fluid moving device 114b over the particular time series, and the "time series-3" pertains to the utilization levels of a third fluid moving device 114c over at the particular time series. For each time point, a vector is constructed with components equal to the value of the univariate time-series at that point. For example, as shown in FIG. 5B, these vectors will be three dimensional with a dimension corresponding to each of "time series-1", "time-series-2" and "time-series-3". These vectors are then stripped of any notion of time and clustered using techniques described in the previous paragraph. The output of the clustering analysis at step 404 is a cluster label or ID for each of these vectors. Thus, the original multivariate time series, which is a sequence of the aforementioned vectors may be described as a sequence of the cluster labels (corresponding to the vectors). As also depicted therein, the clusters 522-528 contain points that correspond to particular data contained in the multivariate time series data 500. It should clearly be understood that the clusters 522-528 depicted in FIG. 5B are for purposes of illustration only and thus are not intended to limit the analyzer 204 discussed herein in any respect.

The cluster label or ID for each of the vectors outputted at step 404 includes a symbolic representation, such as, a color, a numeric value, a letter value, a symbol, a combination of these representations, etc. Thus, for instance, all of the points contained in one cluster 522 are assigned the same symbolic representation, which differs from the symbolic representations assigned to the points in other clusters 524-528. In the example depicted in FIG. 5B, each of the points is assigned a letter value. In addition, at step 406, the symbolic representations of the points contained in the clusters 522-528 are encoded based upon the order in which the points in the clusters 522-528 occur, for instance, by the clustering module 210. More particularly, the clustering module 210 may be configured to arrange the symbolic representations in a symbol stream according to the order in which the clusters occur in the time series, as shown in FIG. 5B. As also shown in FIG. 5B, the arrows between the clusters 522-528 generally indicate the time relationship between each of the points contained in the clusters 522-528.

At step 408, transitions in the sequence of symbols generated at step 406 are encoded, for instance, by the event encoding module 212. Thus, for instance, the transitions may be identified as instances in the sequence of symbols where the cluster labels change, where the colors representing the points in the clusters change, etc. An example of the transition encoding is depicted in FIG. 5B. As shown therein, the locations along the symbol sequence where transitions in the symbols occur are identified.

At step 410, a frequent motif mining operation is performed over the sequence of transitions, for instance, by the motif mining module 214, to mine for patterns in the sequence of transitions. A conventional frequent episode mining algorithm may be implemented to mine for the patterns. An example of a suitable frequent episode mining algorithm is the level-wise (apriori-style) episode mining, in which, a candidate generation operation is followed by counting. In any regard, through performance of the frequent motif mining operation, the motifs or patterns that occur more frequently than other motifs or patterns are identified because those motifs or patterns occurred over a long period of time. One result of this identification is that an operator may have confidence that the fluid moving devices 114a-114n may be operated in those modes.

A result of step 410 is an identification of frequently occurring motifs, each of which is a pattern that repeats over a period of time. In addition, the lengths of time that each of the motifs occur is also identified as a result of step 410. As such, following step 410, each of the occurrences of the motifs and the time periods during which the motifs occur are identified at step 410.

At step 412, sustainability metric levels of the frequently occurring motifs identified at step 410 are determined, for instance, by the sustainability characterizing module 216. Although any suitable sustainability metric may be characterized at step 412, examples of suitable sustainability metrics include, coefficient of performance (COP), power consumption, energy destruction, carbon footprint, etc. By way of particular example, the COP levels for each of the frequently occurring motifs may be determined through a determination of how efficiently the fluid moving devices 114a-114n provides cooling at each of the frequently occurring motifs. The COP of a particular fluid moving device 114a (i) may be defined as the ratio between the cooling provided and the power consumed. In other words:

$$COP_i = \frac{L_i}{P_i}. \quad \text{Equation (1)}$$

In Equation (1), in Equation (1), $L_i$ is the cooling load on the ith fluid moving device and $P_i$ is the power consumed by the ith fluid moving device. In one example, for each of the frequently occurring motifs, an average of the total amount of cooling by the fluid moving devices 114a-114n and an average power consumption of the fluid moving devices 114a-114n during each of the motifs may be determined and used in Equation (1) to determine the COPs of each of the frequently occurring motifs.

Another sustainability metric level that may be determined for each of the frequently occurring motifs at step 412 is a metric that reflects the frequency and amplitude of oscillations in utilization values for each of the motifs. According to an example, the frequency of oscillations of the motifs are estimated by computing the number of mean-crossings, that is, the number of times the utilization levels of the fluid moving devices 114a-114n in each of the motifs crosses a mean value. Thus, for instance, the number of mean-crossings and a standard deviation may be used to determine the frequency of oscillations of the motifs.

In addition, at step 412, the sustainability metric levels for each of the motifs are compared with the sustainability metric levels for each of the other motifs to determine which of the motifs have the most beneficial sustainability metric levels. In one regard, the motifs may be ranked with respect to each other based upon their sustainability metric levels and an operator may consider the ranking in determining which of the motifs yields the best results in terms of their sustainability metric levels. More particularly, motifs having higher COP and/or lower power consumption, carbon footprint, energy destruction, etc., levels may be deemed to be more beneficial as compared with motifs having lower COP and/or higher power consumption, carbon footprint, energy destruction, etc., levels. In addition, motifs having lower frequencies of oscillation may be deemed to be more beneficial as compared with motifs having higher frequencies of oscillation. In one regard, rapid oscillations in the utilization levels of the fluid moving devices 114a-114n are deemed to be detrimental because frequent start and stop cycles lead to fatigue of mechanical parts due to high torque requirements and deterioration of electrical circuitry due to high inrush current. Moreover, demand fluctuations due to cycling may also lead to drops in power factor and potential penalties from the utility. Furthermore, in instances where data centers have on-site generation, such fluctuations may lead to reliability issues at the generators.

At step 414, operational settings for the fluid moving devices 114a-114n are identified based upon the sustainability metric levels of the frequently recurring motifs characterized at step 412, for instance, by the setting identifying module 218. According to an embodiment, the operational settings for the fluid moving devices 114a-114n corresponds to the settings associated with the motif having the most beneficial metric level. According to another embodiment, the operational settings for the fluid moving devices 114a-114n also corresponds to the settings associated with the motif having the lowest frequency of oscillation.

In addition, the identified operational settings may be outputted through the output module 220 as discussed above with respect to step 310 in FIG. 3.

Some or all of the operations set forth in the methods 300 and 400 may be contained as utilities, programs, or subprograms, in any desired computer accessible medium. In addition, the methods 300 and 400 may be embodied by computer programs, which can exist in a variety of forms both active and inactive. For example, they may exist as software program(s) comprised of program instructions in source code, object code, executable code or other formats. Any of the above may be embodied on a computer readable storage medium.

Exemplary computer readable storage media include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 6:
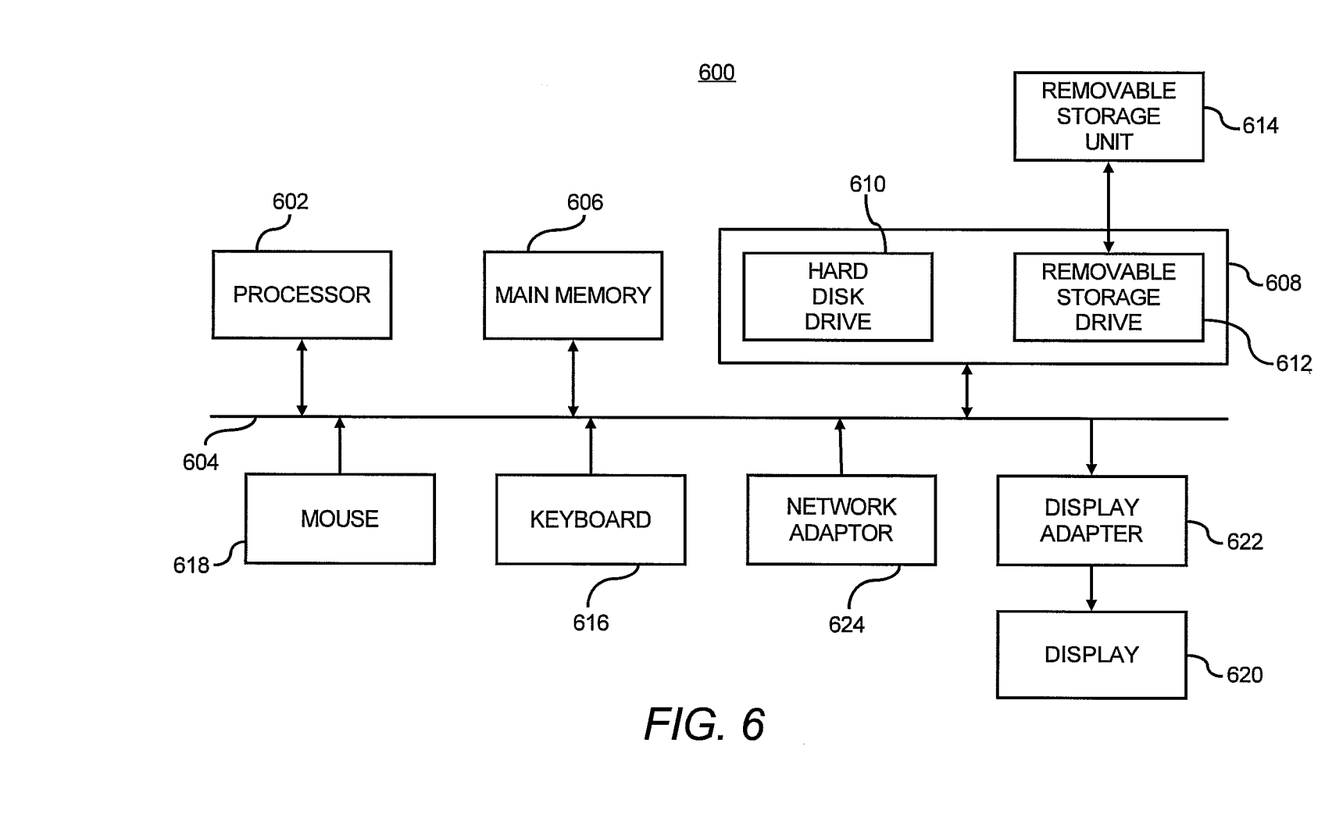
FIG. 6 illustrates a computer system, which may be employed to perform various functions described herein, according to an embodiment of the invention.

FIG. 6 illustrates a block diagram of a computing apparatus 600 configured to implement or execute the methods 300 and 400 depicted in FIGS. 3 and 4, according to an example. In this respect, the computing apparatus 500 may be used as a platform for executing one or more of the functions described hereinabove with respect to the analyzer 204.

The computing apparatus 600 includes a processor 602 that may implement or execute some or all of the steps described in the methods 300 and 400. Commands and data from the processor 602 are communicated over a communication bus 604. The computing apparatus 600 also includes a main memory 606, such as a random access memory (RAM), where the program code for the processor 602, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for the methods 300 and 400 may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor(s) 602 may communicate over a network, for instance, the Internet, LAN, etc., through a network adaptor 624.

It will be apparent to one of ordinary skill in the art that other known electronic components may be added or substituted in the computing apparatus 600. It should also be apparent that one or more of the components depicted in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A computer-implemented method for determining suitable operational settings for a plurality of fluid moving devices, the method comprising:
   identifying, by an analyzer coupled to a computing apparatus, motifs in utilization data of the plurality of fluid moving devices collected over a time series;
   obtaining the utilization data as a multivariate time series of data pertaining to the plurality of fluid moving devices;
   performing a clustering analysis on the multivariate time series data to generate symbolic representations of points contained in a plurality of clusters of the multivariate time series data;
   calculating, by the analyzer, sustainability metric levels for each of the identified motifs;
   determining, by the analyzer, the suitable operational settings corresponding to identified motifs that have favorable sustainability metric levels;
   receiving, by the computing apparatus, the suitable operational settings; and
   varying, by the computing apparatus, operational settings of the plurality of fluid moving devices to match the suitable operational settings.

2. The method according to claim 1, further comprising:
   outputting the identified operational settings.

3. The method according to claim 1, further comprising:
   encoding the symbolic representations based upon an order in which the points occur to generate a sequence of symbols.

4. The method according to claim 1, further comprising:
   identifying transitions in the sequence of symbols;
   encoding the transitions to generate a sequence of transitions;
   identifying patterns in the encoded sequence of transitions; and
   wherein identifying the motifs further comprises identifying the motifs from the identified patterns.

5. The method according to claim 4, wherein identifying the motifs further comprises:
   mining the sequence of transitions to identify frequently occurring motifs in the sequence of transitions; and
   wherein calculating sustainability metric levels for each of the identified motifs further comprises calculating sustainability metric levels for the identified frequently occurring motifs.

6. The method according to claim 5, wherein calculating the sustainability metric levels further comprises determining a frequency of oscillations of the identified frequently occurring motifs.

7. The method according to claim 1, further comprising:
   ranking the identified motifs determined to have favorable sustainability metric levels according to the sustainability metric levels of the identified motifs.

8. A computing apparatus coupled to an analyzer for determining suitable operational settings for a plurality of fluid moving devices, the analyzer comprising:
   a motif mining module to identify motifs in utilization data of the plurality of fluid moving devices collected over time series;
   a data collection module to obtain the utilization data as a multivariate time series of data pertaining to the plurality of fluid moving devices;
   a clustering module to perform a clustering analysis on the multivariate time series data to generate symbolic representations of points contained in a plurality of clusters of the multivariate time series data;
   a sustainability characterizing module to calculate sustainability metric levels for each of the identified motifs and to determine the suitable operational settings corresponding to the identified motifs that have favorable sustainability metric levels; wherein the computing apparatus:
   receives the suitable operational settings; and
   varies operational settings of the plurality of fluid moving devices to match the suitable operational settings.

9. The analyzer according to claim 8, further comprising:
   an event encoding module to encode the symbolic representations based upon an order in which the points occur to generate a sequence of symbols, to identify transitions in the sequence of symbols, and to encode the transitions to generate a sequence of transitions.

10. The analyzer according to claim 9, wherein the motif mining module is further to identify patterns in the encoded sequence of transitions and to identify the motifs from the identified patterns.

11. The analyzer according to claim 10, wherein the motif mining module is further to mine the sequence of transitions to identify frequently occurring motifs in the sequence of transitions and wherein the sustainability characterizing module is further to calculate sustainability metric levels for the identified frequently occurring motifs.

12. The analyzer according to claim 8, wherein the sustainability characterizing module is further configured to rank the identified motifs determined to have favorable sustainability metric levels according to the sustainability metric levels of the identified motifs.

13. A non-transitory computer readable storage medium on which is embedded a computer programs, the computer programs executable by a processor in a computing apparatus for implementing a method for determining suitable operational settings for a plurality of fluid moving devices, the computer programs comprising a set of instructions to:
   identify motifs in utilization data of the plurality of fluid moving devices collected over a time series;
   obtain the utilization data as a multivariate time series of data pertaining to the plurality of fluid moving devices;
   perform a clustering analysis on the multivariate time series data to generate symbolic representations of points contained in a plurality of clusters of the multivariate time series data;
   calculate sustainability metric levels for each of the identified motifs;
   determine which of the identified motifs have favorable sustainability metric levels;
   identify operational settings of the plurality of fluid moving devices that correspond to the motifs determined to have favorable sustainability metric levels as the suitable operational settings for the plurality of fluid moving devices; and
   vary operational settings of the plurality of fluid moving devices to match the determined operational settings.

14. The non-transitory computer readable storage medium according to claim 13, the computer programs further comprising a set of instructions to:
   encode the symbolic representations based upon an order in which the points occur to generate a sequence of symbols.

15. The non-transitory computer readable storage medium according to claim 14, the computer programs further comprising a set of instructions to:
   identify transitions in the sequence of symbols;
   encode the transitions to generate a sequence of transitions;
   identify patterns in the encoded sequence of transitions; and
   wherein to identify the motifs further comprises to identify the motifs from the identified patterns.

* * * * *